(12) United States Patent
Rouaissia et al.

(10) Patent No.: US 12,474,185 B2
(45) Date of Patent: Nov. 18, 2025

(54) CAPACITIVE SENSOR DEVICE WITH DRIFT COMPENSATION

(71) Applicant: Semtech Corporation, Camarillo, CA (US)

(72) Inventors: Chaouki Rouaissia, Neuchâtel (CH); Sébastien Grisot, Bourdry (CH); Jerald G. Ott, III, Escondido, CA (US)

(73) Assignee: Semtech Corporation, Camarillo, CA (US)

( * ) Notice: Subject to any disclaimer, the term of this patent is extended or adjusted under 35 U.S.C. 154(b) by 233 days.

(21) Appl. No.: 18/138,985

(22) Filed: Apr. 25, 2023

(65) Prior Publication Data

US 2023/0349730 A1    Nov. 2, 2023

Related U.S. Application Data

(60) Provisional application No. 63/335,508, filed on Apr. 27, 2022.

(51) Int. Cl.
| | |
|---|---|
| *G01D 5/24* | (2006.01) |
| *G01R 27/26* | (2006.01) |
| *H03K 17/955* | (2006.01) |

(52) U.S. Cl.
CPC ........... *G01D 5/24* (2013.01); *G01R 27/2605* (2013.01); *H03K 17/955* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G01D 3/00; G01D 3/028; G01D 3/036; H03K 17/00; H03K 17/94; H03K 17/945; H03K 17/955; H03K 17/96; H03K 17/962; H03K 2217/00;

(Continued)

(56) References Cited

U.S. PATENT DOCUMENTS

| | | | |
|---|---|---|---|
| 11,474,648 B2* | 10/2022 | Rouaissia | ............ H03K 17/955 |
| 11,966,539 B2* | 4/2024 | Yan | ........................ G06F 3/0446 |
| 2008/0047764 A1 | 2/2008 | Lee | |

(Continued)

FOREIGN PATENT DOCUMENTS

| | | |
|---|---|---|
| EP | 3751397 A1 | 12/2020 |
| EP | 3796140 A1 | 3/2021 |

*Primary Examiner* — Hoai-An D. Nguyen
(74) *Attorney, Agent, or Firm* — BLANK ROME LLP

(57) ABSTRACT

A capacitive sensor device with a capacitance-measuring circuit, a main sense input and a reference sense input, wherein the capacitive sensor device is configured to measure, using the capacitance-measuring circuit, a current main value of capacitance seen by the main sense input and a current reference value of capacitance seen by the reference sense input, wherein the capacitive sensor device is configured to store one previously measured reference value, and wherein the capacitive sensor device is configured to use 1) the current main value, 2) the current reference value and the previously measured reference value, and 3) a current correction coefficient, the capacitive sensor device being configured to adaptively determine the current correction coefficient based on the current reference value and the previously measured reference value, for determining a corrected current main value of capacitance; the capacitive sensor device can be used in a portable electronic device.

14 Claims, 1 Drawing Sheet

(58) Field of Classification Search
CPC ....... H03K 2217/94; H03K 2217/9401; H03K 2217/94026; H03K 2217/94031
USPC ........................................ 324/600, 649, 658
See application file for complete search history.

(56) References Cited

U.S. PATENT DOCUMENTS

| | | | |
|---|---|---|---|
| 2009/0153152 A1* | 6/2009 | Maharyta | G06F 3/0443 |
| | | | 324/684 |
| 2014/0354582 A1 | 12/2014 | Horne | |
| 2020/0169220 A1* | 5/2020 | Lespinats | H02S 50/10 |

* cited by examiner

CAPACITIVE SENSOR DEVICE WITH DRIFT COMPENSATION

REFERENCE DATA

The present application claims the benefits of prior date of U.S. provisional application 63/335,508 of Apr. 27, 2022, the contents whereof are hereby incorporated in their entirety.

FIELD OF THE INVENTION

The present invention relates to a capacitive sensor device and to a portable electronic device comprising the capacitive sensor device.

BACKGROUND TO THE INVENTION

Proximity awareness is a requirement in most recent smartphones and connected personal devices, where it is used to limit radiation dose, to prevent accidental inputs on a touch display, to dim a backlit panel, and in many other cases. Document EP3796140 discloses a capacitive sensor device that can be used among others to detect proximity of a user's body part in a portable phone, a tablet, or a similar portable electronic device.

Capacitance measured by a capacitive sensor device is typically subject to drift due to environmental influences, e.g., changing temperature or humidity. Changing environmental influences typically change physical properties of at least parts of the portable electronic device and of the capacitive sensor device by, e.g., changing thicknesses or permittivity of materials, thereby changing measured capacitances. Based on such altered capacitance measurements due to environmentally caused drift, the capacitive sensor device may determine faulty proximity signals.

It is an object of the present invention to mitigate at least some of the disadvantages associated with capacitive sensor devices known from the state of the art.

SUMMARY OF THE INVENTION

According to a first aspect of the present invention there is provided a capacitive sensor device involving the features recited in claim 1. Further optional features and embodiments of the capacitive sensor device are described in the dependent patent claims.

The invention relates to a capacitive sensor device comprising a capacitance-measuring circuit, a main sense input and a reference sense input, wherein the capacitive sensor device is configured to measure, using the capacitance-measuring circuit, a current main value of capacitance seen by the main sense input and a current reference value of capacitance seen by the reference sense input, wherein the capacitive sensor device is configured to at least temporarily store at least one previously measured reference value, and wherein the capacitive sensor device is configured to use 1) the current main value, 2) the current reference value and the at least one previously measured reference value, and 3) at least one current correction coefficient, with the capacitive sensor device being configured to adaptively determine the at least one current correction coefficient based on at least the current reference value and the at least one previously measured reference value, for determining a corrected current main value of capacitance.

The correcting of measured main values on the capacitive sensor device may be carried out in real time. Whenever a new current main value is measured, correction may be carried out. The capacitance seen by the reference sense input may be substantially only sensitive to environmental drifts, e.g., temperature changes in the vicinity of the capacitive sensor device, and the capacitance seen by the main sense input may be sensitive to both environmental drifts, e.g., aforementioned temperature changes, and to approaching/receding conductive bodies, e.g., embodied as human bodies. The current main value $MV(t_n)$ may be sampled by the capacitance-measuring circuit at a time $t_n$, and the current reference value may also be sampled at the time ty or at a different time. Main values and reference values need not be sampled at the same sampling times. Previously measured reference values may have been sampled at times $t_{n-1}$, $t_{n-2}$, ... by the capacitance-measuring circuit. The following reference values may therefore be sampled and available for further processing: $RV(t_n)$, $RV(t_{n-1})$, $RV(t_{n-2})$, ..., potentially back to a first acquired capacitance measurement $RV(t_0)$ at a first sampling time to.

In an embodiment of the capacitive sensor device according to the invention, the capacitive sensor device is configured to adaptively determine the at least one current correction coefficient by adaptively selecting, based on a selection criterion based on the current reference value and the at least one previously measured reference value, the at least one current correction coefficient from at least two predetermined correction coefficients, and wherein the selection criterion comprises a comparison to at least one threshold.

The at least two predetermined correction coefficients may be stored on the capacitive sensor device. The at least two predetermined correction coefficients may be determined in a calibration process. The at least two predetermined correction coefficients may correspond to different operating conditions. In case the at least two predetermined correction coefficients comprise, e.g., only two predetermined correction coefficients, a first of the two predetermined correction coefficients may correspond to an operating condition of rising temperature, while a second of the two predetermined correction coefficients may correspond to an operating condition of falling temperature. In general, the capacitive sensor device may use the measured reference values to determine which operating condition is currently applicable and select as the at least one current correction coefficient predetermined correction coefficient(s) from the at least two predetermined correction coefficients corresponding to the determined operating condition. The just-described principle for determining the least one current correction coefficient may also be applicable to other physical reasons-besides temperature changes-causing different operating conditions in which different correction coefficients may be needed to optimally correct environmental drift in the main values. Selecting correction coefficients may be based on comparison operations with respect to at least one threshold.

In a further embodiment of the capacitive sensor device according to the invention, the capacitive sensor device is configured to determine a current difference reference value between the current reference value and a comparison reference value from the at least one previously measured reference value, and the comparison comprises comparing the current difference reference value to the at least one threshold.

A current difference reference value may be determined by the following operation: $\Delta RV(t_n)=RV(t_n)-RV(t_{n-1})$. A current difference reference value may, however, also be determined as follows: $\Delta RV(t_n)=RV(t_n)-RV(t_{n-m})$, with m greater than one. This way, samples of reference values which were determined earlier than the last previously (previous referring to the current sampling time $t_n$) acquired sample at time $t_{n-1}$ may be used for determining a current difference reference value. The current difference reference value may be compared to at least one threshold: based on such a comparison, it may be determined which operating condition is currently applicable and which at least one current correction coefficient should be selected from the at least two predetermined correction coefficients, for example. A threshold of zero may be used to measure whether the reference value is increasing or decreasing. In case an increasing environmental temperature in the vicinity of the capacitive sensor device leads to an increasing reference value and a decreasing temperature leads to a decreasing reference value, a threshold of zero may be used to determine if environmental temperature is increasing or decreasing, for example.

In a further embodiment of the capacitive sensor device according to the invention, the at least two predetermined correction coefficients comprise a first first order correction coefficient and a second first order correction coefficient which differ from one another and wherein a single current correction coefficient is adaptively selected from the first first order correction coefficient and the second first order correction coefficient, wherein the at least one threshold comprises a single threshold, and wherein the capacitive sensor device is configured to determine whether the current difference reference value is larger or smaller than the single threshold, wherein for a larger current difference reference value the first first order correction coefficient is selected as the single current correction coefficient and for a smaller current difference reference value the second first order correction coefficient is selected as the single current correction coefficient, and wherein the capacitive sensor device is configured to determine the corrected current main value by subtracting the product of the single current correction coefficient and a cumulated difference reference value from the current main value.

Environmentally caused drift may be removed from the current main value using a first-order linear correction in which only a single current correction coefficient is used. The single threshold TS may be compared to the current difference reference value $\Delta RV(t_n)$: if $\Delta RV(t_n) > TS$, the first first order correction coefficient $C_{1;1}$ may be selected as the single current correction coefficient $C_n$, and if $\Delta RV(t_n) < TS$, the second first order correction coefficient $C_{2;1}$ may be selected as the single current correction coefficient $C_n$. In case $\Delta RV(t_n) = TS$, $C_{1;1}$ or $C_{2;1}$ may be selected. After selecting the single current correction coefficient Cy as just described, the corrected current main value $MV^*(t_n)$ may be determined as follows: $MV^*(t_n) = MV(t_n) - C_n \Delta RV^{(0)}(t_n)$, with $\Delta RV^{(0)}(t_n)$ being the cumulated difference reference value defined as $\Delta RV^{(0)}(t_n) = RV(t_n) - RV(t_0)$. The single threshold may be assigned a value of zero. The first first order correction coefficient may correspond to rising temperature, and the second first order correction coefficient may correspond to falling temperature.

In a further embodiment of the capacitive sensor device according to the invention, the at least two predetermined correction coefficients comprise a first first order correction coefficient and a second first order correction coefficient which differ from one another and wherein a single current correction coefficient is adaptively selected from the first first order correction coefficient and the second first order correction coefficient, wherein the capacitive sensor device is configured to at least temporarily store at least one previously determined difference reference value, and wherein the capacitive sensor device is configured to determine a filtered current difference reference value by applying a filter to the current difference reference value and the at least one stored previously determined difference reference value, wherein the at least one threshold comprises a single threshold, and wherein the capacitive sensor device is configured to determine whether the filtered current difference reference value is larger or smaller than the single threshold, wherein for a larger filtered current difference reference value the first first order correction coefficient is selected as the single current correction coefficient and for a smaller current difference reference value the second first order correction coefficient is selected as the single current correction coefficient, and wherein the capacitive sensor device is configured to determine the corrected current main value by subtracting the product of the single current correction coefficient and a cumulated difference reference value from the current main value.

For a new reference value sampled at time ty, $RV(t_n)$, the current difference reference value $\Delta RV(t_n)$ may be determined. The capacitive sensor device may also store previously determined difference reference values, e.g., previously determined difference reference value $\Delta RV(t_{n-1}) = RV(t_{n-1}) - RV(t_{n-2})$, $\Delta RV(t_{n-2})$, and so on. The current difference reference value and at least one previously determined difference reference value may, for example, be stored in a fixed-size buffer. The fixed-size buffer may, for example, be set up in such a way that it can store l different difference reference values. Before the current difference reference value $\Delta RV(t_n)$ is stored in the fixed-size buffer, the fixed-size buffer may comprise, for example, the following difference reference values: $\Delta RV(t_{n-l})$, ..., $\Delta RV(t_{n-1})$. To store $\Delta RV(t_n)$ in the fixed-size buffer, $\Delta RV(t_{n-l})$ may be removed, providing the following difference reference values in the fixed-size buffer: $\Delta RV(t_{n-l+1})$, ..., $\Delta RV(t_n)$. A causal finite impulse response (FIR) filter, e.g., providing smoothing/averaging, may operate on the elements in the fixed-size buffer to provide a filtered current difference reference value $\widehat{\Delta RV}(t_n)$, and this filtered current difference reference value may be compared to a single threshold TS stored on the capacitive sensor device: if $\widehat{\Delta RV}(t_n) > TS$, a first first order correction coefficient $C_{1;1}$ may be selected as the current correction coefficient $C_n$, and if $\widehat{\Delta RV}(t_n) < TS$, a second first order correction coefficient $C_{2;2}$ may be selected as the current correction coefficient $C_n$. In case $\widehat{\Delta RV}(t_n) = TS$, $C_{1;1}$ or $C_{2;1}$ may be selected. After selecting the single current correction coefficient Cy as just described, the corrected current main value $MV^*(t_n)$ may be determined as follows: $MV^*(t_n) = MV(t_n) - C_n \Delta RV^{(0)}(t_n)$, with $\Delta RV^{(0)}(t_n)$ being the cumulated difference reference value defined as $\Delta RV^{(0)}(t_n) = RV(t_n) - RV(t_0)$. The single threshold may be assigned a value of zero. The first first order correction coefficient may correspond to rising temperature, and the second first order correction coefficient may correspond to falling temperature. Depending on the size of l, the number of entries in the fixed-size buffer, and the FIR filter employed, $\widehat{\Delta RV}(t_n)$ may correspond to an average direction, i.e., a slope/trend, of the reference values close to the current reference value $RV(t_n)$. In case a delay is acceptable, the FIR filter may also be noncausal.

In a further embodiment of the capacitive sensor device according to the invention, the at least two predetermined correction coefficients comprise a first first order correction coefficient, a second first order correction coefficient, a first second order correction coefficient and a second second order correction coefficient, wherein two current correction coefficients are adaptively selected from these four predetermined correction coefficients, wherein the at least one threshold comprises a single threshold, and wherein the capacitive sensor device is configured to determine whether the current difference reference value is larger or smaller than the single threshold, wherein for a larger current difference reference value the first first order correction coefficient is selected as a first current correction coefficient of the two current correction coefficients and the first second order correction coefficient is selected as a second current correction coefficient of the two current correction coefficients, and wherein for a smaller current difference reference value the second first order correction coefficient is selected as a first current correction coefficient of the two current correction coefficients and the second second order correction coefficient is selected as a second current correction coefficient of the two current correction coefficients, and wherein the capacitive sensor device is configured to determine the corrected current main value by subtracting the product of the first current correction coefficient and a cumulated difference reference value and the product of the second current correction coefficient with the square of the cumulated difference reference value from the current main value.

The first first order correction coefficient $C_{1;1}$, the second first order correction coefficient $C_{2;1}$, the first second order correction coefficient $C_{1;2}$ and the second second order correction coefficient $C_{2;2}$ may be stored on the capacitive sensor device and obtained in a calibration procedure. The capacitive sensor device may correct the current main value $MV(t_n)$ based on a first current correction coefficient, wherein the value assigned to the first current correction coefficient may be adaptively selected as the first first order correction coefficient or as the second first order correction coefficient, and a second current correction coefficient, wherein the value assigned to the second current correction coefficient may be adaptively selected as the first second order correction coefficient or as the second second order correction coefficient. The single threshold TS may be compared to the current difference reference value $\Delta RV(t_n)$: if $\Delta RV(t_n) > TS$, the first first order correction coefficient $C_{1;1}$ may be selected as the first current correction coefficient $C_n^{(1)}$ and the first second order correction coefficient $C_{1;2}$ may be selected as the second current correction coefficient $C_n^{(2)}$, and if $\Delta RV(t_n) < TS$, the second first order correction coefficient $C_{2;1}$ may be selected as the first current correction coefficient $C_n^{(1)}$ and the second second order correction coefficient $C_{2;2}$ may be selected as the second current correction coefficient $C_n^{(2)}$. For $\Delta RV(t_n) = TS$, it may be arbitrary which of the predetermined correction coefficients is assigned to the two current correction coefficients. The corrected current main value $MV^*(t_n)$ may be determined as follows: $MV^*(t_n) = MV(t_n) - C_n^{(1)} \Delta RV^{(0)}(t_n) - C_n^{(2)} (\Delta RV^{(0)}(t_n))^2$, with $\Delta RV^{(0)}(t_n)$ being the cumulated difference reference value defined as $\Delta RV^{(0)}(t_n) = RV(t_n) - RV(t_0)$. The single threshold may be assigned a value of zero. The just-described correction corrects therefore both first-order components and second-order drift components in the main values. This may be particularly beneficial in case the relationship/ratio between main values and reference values is far away from a first order relationship, and this may in particular be influenced by the hardware implementation of the capacitive sensor device, specifically by the presence of discrete components and by the location of heat sources etc.

In a further embodiment of the capacitive sensor device according to the invention, the at least one threshold comprises a first threshold and a second threshold, wherein the first threshold is smaller than the second threshold, and wherein the at least two predetermined correction coefficients comprise a first correction coefficient, a second correction coefficient and a third correction coefficient, wherein a single current correction coefficient is adaptively selected from these three predetermined correction coefficients, and wherein the capacitive sensor device is configured to select 1) the first correction coefficient as the single current correction coefficient if a cumulated difference reference value is smaller than the first threshold, 2) the second correction coefficient as the single current correction coefficient if the cumulated difference reference value is larger than or equal to the first threshold and smaller than or equal to the second threshold, and 3) the third correction coefficient as the single current correction coefficient if the cumulated difference reference value is larger than the second threshold, and wherein the capacitive sensor device is configured to determine the corrected current main value by subtracting the product of the single current correction coefficient and the cumulated difference reference value from the current main value.

In general, the at least one threshold may comprise k thresholds $TS_1, TS_2, \ldots, TS_k$ which may be sorted in ascending order. These k thresholds may segment the real line into k+1 segments. To each of these k+1 segments, different predetermined correction coefficients may be associated which may be stored on the capacitive sensor device. In case the cumulated reference value, or alternatively a filtered cumulated reference value, is found to lie in segment i, the current correction coefficients may be set to the predetermined correction coefficients associated to said segment i. In case only a first-order drift correction is carried out, for example, to each segment there may be associated one first order correction coefficient. In case a first-order drift correction and a second-order drift correction are carried out, for example, to each segment there may be associated one first order correction coefficient and one second order correction coefficient. Preferentially, the real line into three may be segmented into three segments using two thresholds. The cumulated difference reference value is defined as $\Delta RV^{(0)}(t_n) = RV(t_n) - RV(t_0)$.

In a further embodiment of the capacitive sensor device according to the invention, the capacitive sensor device is configured to at least temporarily store at least one previously adaptively selected at least one correction coefficient, and the capacitive sensor device is configured to determine at least one updated current correction coefficient by applying a filter to the 1) at least one current correction coefficient and the 2) at least one previously adaptively selected at least one correction coefficient, and wherein the capacitive sensor device is configured to replace the at least one current correction coefficient with the at least one updated current correction coefficient for determining the corrected current main value.

Quick switching between correction coefficients may lead to unwanted steps and noise in the corrected main values. If correction coefficients are, for example, selected based on whether temperature is increasing or decreasing (which may be detected by measuring whether reference values are increasing or decreasing), temperature noise may lead to quick successions of correction coefficient switches. The correction coefficients may be smoothed to reduce such unwanted steps in the corrected main values. Smoothing or more general filtering may proceed using a FIR filter or an infinite impulse response (IIR) filter. The capacitive sensor device may store previously selected correction coefficients.

The at least one current correction coefficient Cy and the stored previously selected at least one correction coefficients $C_{n-1}, C_{n-2}, \ldots, C_{n-p}$ (p previously selected at least one correction coefficients may be stored) may be filtered with a causal FIR filter, the FIR filtering providing at least one updated current correction coefficient $\widetilde{C_n}$. The at least one current correction coefficient $C_n$ and the stored previously selected at least one correction coefficients $C_{n-1}, C_{n-2}, \ldots, C_{n-p}$ may also be filtered using an IR filter: for a general IR filter, previously selected at least one updated correction coefficients $\widetilde{C_{n-1}}, \widetilde{C_{n-2}}, \ldots, \widetilde{C_{n-q}}$ may be stored on the capacitive sensor device; the IIR filter may be embodied as a causal recursive system. For both FIR filter and IIR filter, p may, for example, be embodied as a power of two, for example one of 1, 2, 4, ..., 128. The FIR filter may be embodied as a weighted average filter, or in any other suitable way. The at least one updated current correction coefficient may then be used for removing drift from the main values: in case a first order drift removal is carried out, correction may proceed as $MV^*(t_n)=MV(t_n)-\widetilde{C_n}\Delta RV^{(0)}(t_n)$. For combined first order and second order correction, correction coefficients corresponding to different order terms may be filtered separately.

In a further embodiment of the capacitive sensor device according to the invention, the filter is a finite impulse response (FIR) filter, or the filter is a causal recursive infinite impulse response (IIR) filter with finitely many nonzero IIR filter coefficients.

In a further embodiment of the capacitive sensor device according to the invention, the capacitive sensor device is configured to at least temporarily store at least one previously measured main value, and the capacitive sensor device is configured to determine a current difference reference value between the current reference value and a comparison reference value from the at least one previously measured reference value and the capacitive sensor device is configured to determine a current difference main value between the current main value and a comparison main value from the at least one previously measured main value, and the capacitive sensor device is configured to at least temporarily store at least one previously determined difference reference value and at least one previously determined difference main value, wherein the capacitive sensor device is configured to determine a filtered current difference reference value by applying a filter to the current difference reference value and the at least one stored previously determined difference reference value and wherein the capacitive sensor device is configured to determine a filtered current difference main value by applying a filter to the current difference main value and the at least one stored previously determined difference main value, and wherein the capacitive sensor device is configured to adaptively determine a single current correction coefficient based on a ratio of the filtered current difference main value and the filtered current difference reference value, wherein the capacitive sensor device is configured to determine the corrected current main value by subtracting the product of the single current correction coefficient and a cumulated difference reference value from the current main value.

As described above, a filtered current difference reference value $\widetilde{\Delta RV}(t_n)$ may be determined which may correspond to an average trend/slope of the reference values close to the current reference value. Analogously, a filtered current difference main value $\widetilde{\Delta MV}(t_n)$ may be determined which may correspond to an average trend/slope of the main values close to the current main value. The filter used for determining the filtered current difference main value may be the same as the filter used for determining the filtered current difference reference value; alternatively, the two filters may differ from one another. Pre-storing correction coefficients on the capacitive sensor device may not provide optimal environmental drift correction as optimal correction coefficients may vary from one portable electronic device to another into which the capacitive sensor device may be integrated, e.g., due to components/assembly/production tolerance/precision. The single current correction coefficient may therefore be determined online, i.e., in real time, for a capacitive sensor device by dividing the filtered current difference main value with the filtered current difference reference value. The accordingly obtained single current correction coefficient may then be used for first order drift removal from the main values. The determined single current correction coefficient and previously determined single current correction coefficients may also be stored on the capacitive sensor device and filtered to for example further smooth the determined single current correction coefficient, e.g., using a causal FIR filter.

In a further embodiment of the capacitive sensor device according to the invention, the capacitive sensor device is configured to determine the single current correction coefficient by comparing the ratio of the filtered current difference main value and the filtered current difference reference value to a lower threshold and/or to an upper threshold, with the upper threshold being larger than the lower threshold, and wherein the capacitive sensor device is configured to 1) set the single current correction coefficient to the lower threshold in case the ratio is smaller than the lower threshold, 2) set the single current correction coefficient to the upper threshold in case the ratio is larger than the upper threshold, and 3) otherwise set the single current correction coefficient to the ratio.

The lower threshold and the upper threshold may be pre-stored on the capacitive sensor device. An approaching/receding conductive body may rapidly change the capacitance seen by the main sense input, leading to a quickly increasing/decreasing current main value. The ratio between the filtered current difference main value and the filtered current difference reference value may in that case quickly increase/decrease, thereby providing a rapidly changing single correction coefficient. To avoid such rapid correction coefficient changes, the single current correction coefficient may be clamped. In case the ratio is smaller than the lower threshold, the value of the single correction coefficient may be set to the lower threshold, and in case the ratio is larger than the upper threshold, the value of the single correction coefficient may be set to the upper threshold. If, for example, based on a typical characterization process it is found that a typical value of the single correction coefficient is 4.5, the lower threshold may be set to four and the upper threshold may be set to five.

In a further embodiment of the capacitive sensor device according to the invention, the main sense input is coupled with a capacitive sense electrode whose self-capacitance changes at an approach of a conductive body and the reference sense input is coupled with a capacitive reference electrode.

In a further embodiment of the capacitive sensor device according to the invention, the capacitive sense electrode is embodied as a conductor area on a printed circuit board, and/or the capacitive reference electrode comprises tracks and/or conductor area on the printed circuit board or the capacitive reference electrode is embodied as a discrete reference capacitor, and/or the capacitive sensor device internally comprises the capacitive reference electrode, and the capacitance of the capacitive reference electrode is less affected by the approach of the conductive body than the capacitance of the capacitive sense electrode.

The capacitive sense electrode may also be embodied as an antenna. The discrete reference capacitor may preferentially be placed close to the antenna to catch similar environmental drift as the antenna. The capacitive reference electrode may be suitably designed in such a way that approaching/receding conductive bodies have only a small/insignificant impact on the measured capacitance of the capacitive reference electrode. The capacitive sensor device may also be provided on the printed circuit board. The capacitive reference electrode may be realized on the same printed circuit board or internally to the capacitive sensor device, for example as a capacitive pad which is not bonded out, or as the analogue-digital converter's mux/floating input. Alternatively, the reference values may also be obtained by other means than capacitive measurements: for example, a temperature sensor using PTAT (proportional to absolute temperature) may be integrated on the printed circuit board on which the capacitive sensor device is placed or internally to the capacitive sensor device.

According to a further aspect of the present invention, there is provided a portable electronic device comprising a capacitive sensor device according to the first aspect of the present invention, wherein the capacitive sensor device is configured to generate a proximity signal based on the corrected current main value, and wherein the portable electronic device is configured to activate a predetermined action when the proximity signal is generated and/or when the proximity signal is extinguished.

The portable electronic device may be embodied as a mobile phone or as a tablet, for example. The generated proximity signal may indicate that a conductive body, e.g., a human body, is close to the portable electronic device. Based on such information, the portable electronic device may for example reduce output power for communications in order to reduce radiation doses absorbed by a human close to the portable electronic device.

In an embodiment of the portable electronic device according to the further aspect of the present invention, the predetermined action is one of: change a power of a radio transmitter, switch on or off a display backlight, enable or disable a tactile input interface.

BRIEF DESCRIPTION OF DRAWINGS

Exemplar embodiments of the invention are disclosed in the description and illustrated by the drawings in which.

DETAILED DESCRIPTION OF DRAWINGS

Figure 1:
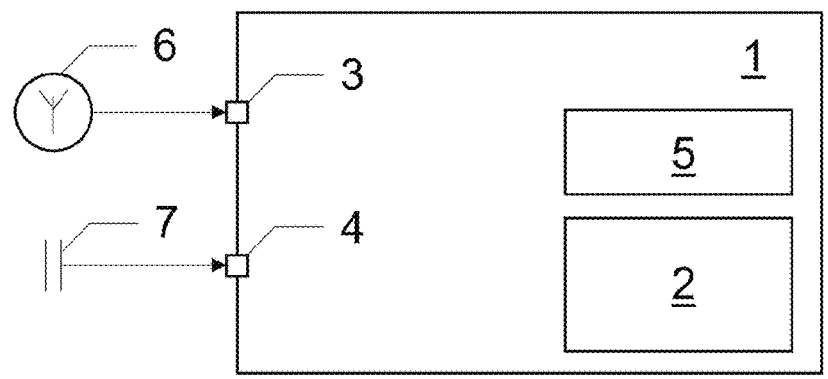
FIG. 1 schematically illustrates a capacitive sensor device according to the invention with a separate capacitive sense electrode and a separate capacitive reference electrode.

FIG. 1 schematically illustrates a capacitive sensor device 1 according to the invention with a separate capacitive sense electrode 6 and a separate capacitive reference electrode 7. The capacitive sensor device 1 comprises a capacitance-measuring circuit 2, a main sense input 3, a reference sense input 4 and a suitable memory 5, e.g., embodied as a buffer or as more general memory. The capacitance-measuring circuit 2 is configured to measure a current main value of capacitance seen by the main sense input 3 and a current reference value of capacitance seen by the reference sense input 4.

As shown in FIG. 1, the capacitance seen by the main sense input 3 may be the self-capacitance of a separate sensor 6, the separate capacitive sense electrode 6, which is detached from the capacitive sensor device 1. The capacitive sense electrode 6 may be embodied as an antenna which may be jointly used by a transceiver of a portable electronic device, which transceiver is used for communication purposes by the portable electronic device, and in which portable electronic device the capacitive sensor device 1 may be integrated. The capacitive sense electrode 6 may also be embodied as a standalone capacitive pad. The capacitive sense electrode 6 may be embodied as a conductor area on a printed circuit board. The capacitive sense electrode 6 may be embodied in such a way that its self-capacitance changes at an approach of a conductive body, e.g., a human body. The capacitance-measuring circuit 2 may detect tiny variations attributable to the approach of the conductive body.

As further shown in FIG. 1, the capacitance seen by the reference sense input 4 may be the capacitance of a separate sensor 7, specifically of a discrete capacitor 7 as shown in FIG. 1. The capacitive reference electrode 7 may be provided by tracks and/or conductor area on a printed circuit board. The capacitive reference electrode is preferentially embodied/placed in such a way that its capacitance is substantially unaffected by approaching or receding conductive bodies and is substantially only sensitive to environmental drift, in particular drift due to changing temperature in the environment of the capacitive sensor device 1. In contrast, the capacitive sense electrode 6 is sensitive to both environmental drift and to capacitance changes due to approaching/receding conductive bodies. The capacitance seen by the reference sense input 4 may also be the capacitance of a connection pin at the reference sense input 4: in this case, no separate capacitive reference electrode 7 may be needed.

Figure 2:
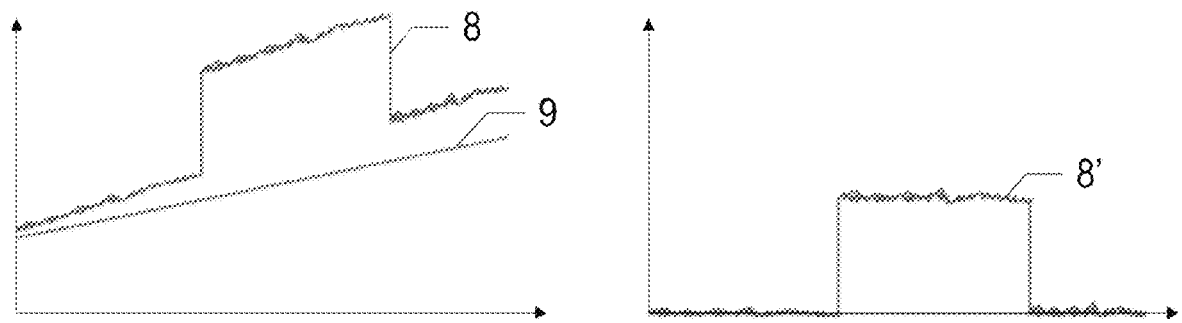
FIG. 2 schematically illustrates temperature drift compensation in a capacitive sensor device as known from the prior art.

FIG. 2 schematically illustrates temperature drift compensation in a capacitive sensor device as known from the prior art. In the sub-figure of FIG. 2 on the left, measured capacitance values 8 (depicted together with an additional noisy component), termed main values, of capacitance seen by the main sense input 3 over a period of time and measured capacitance values 9, termed reference values, of capacitance seen by the reference sense input 4 over the same period of time are shown. The x-axis denotes time in both sub-figures of FIG. 2. In the sub-figure of FIG. 2 on the left, environmental temperature increases over time, leading to a drift in both measured main values 8 and reference values 9. In the main values 8 shown in FIG. 2, there is an additional jump in the measured main values 8. This jump indicates the (sudden) presence of a conductive body, which inductive body increases the measured capacitance. For the capacitive sensor device to be able to detect the (sudden) presence of a conductive body indicated by the jump in FIG. 2, it is helpful to remove the drift in the measured main values 8. To remove this temperature drift from the measured main values 8, in the prior art it is assumed that the temperature drift in the main values 8 is the same as or proportional to the temperature drift in the reference values 9.

In the prior art, temperature drift removal is typically carried out as follows. At a sampling time $t_n$, a corrected main value $MV^*(t_n)$ is determined based on a linear correction $MV^*(t_n)=MV(t_n)-C\cdot\Delta RV^{(0)}(t_n)$, with $MV(t_n)$ being the measured main value at time ty, C a (correction) coefficient, $\Delta RV^{(0)}(t_n)=RV(t_n)-RV(t_0)$ and $RV(t_n)$ being the measured reference value at time ty and $RV(t_0)$ being the measured reference value at an initial sampling time to. $\Delta RV^{(0)}(t_n)$ therefore measures a direction in the reference values with respect to the reference value at the initial sampling time. In the prior art, coefficient C is obtained using a calibration process and stored on the capacitive sensor device; once calibrated, C is not adapted during runtime. Calibration to determine a value for C is in the prior art typically carried out when no conductive body is close to the capacitive sensor device. Temperature drift removal as carried out in the prior art is typically done in real time and for each new sample of the main value. The sub-figure of FIG. 2 on the right shows the corrected main values 8', with temperature drift removed as known from the prior art and previously described.

Figure 3:
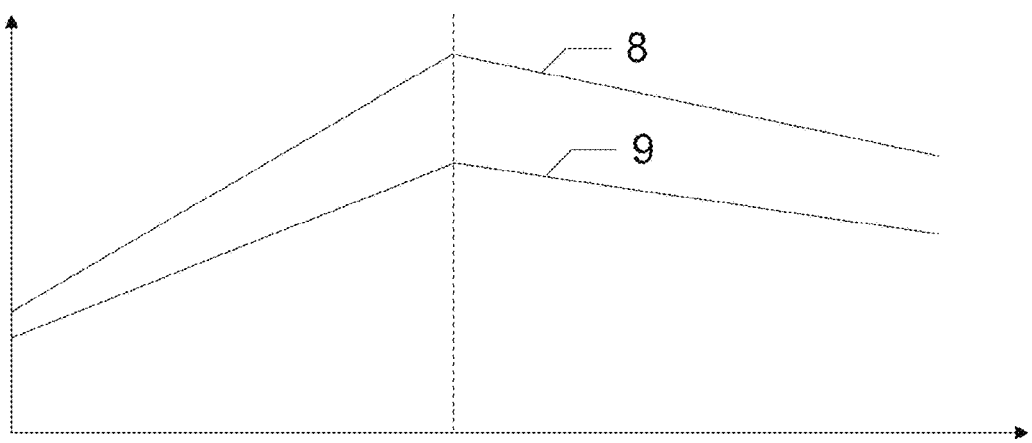
FIG. 3 schematically illustrates the need for adapting correction coefficients over time as carried out in a capacitive sensor device according to the invention.

FIG. 3 schematically illustrates the need for adapting correction coefficients over time as carried out in a capacitive sensor device according to the invention. In FIG. 3, the x-axis represents time, while the y-axis represents capacitance values. The central vertical dashed line in FIG. 3 separates a first region to its left in which environmental temperature is rising from a second region to its right in which environmental temperature is falling. Main values 8 of capacitance seen by the main sense input 3 may rise with increasing temperature and may fall with decreasing temperature, and reference values 9 of capacitance seen by the reference sense input 4 may also rise with increasing temperature and may fall with decreasing temperature, but the proportionality factors between the main values 8 and the reference values 9 may differ between rising temperatures and falling temperatures. In an embodiment of the capacitive sensor device 1 according to the invention, based on the reference values it is determined whether environmental temperature is rising or falling, and if 1) rising, a coefficient for rising temperature conditions may be used for temperature drift removal from the measured main values 8, and if 2) falling, a coefficient for falling temperature conditions may be used for temperature drift removal from the measured main values 8. The example shown in FIG. 3 is only illustrative; in realistic conditions, for example, rising and falling temperatures may arbitrarily vary over time. Other strategies of adapting correction coefficients are disclosed in the embodiments of the capacitive sensor device 1 according to the invention.

REFERENCE SIGNS APPEARING IN THE DRAWINGS

1 capacitive sensor device
2 capacitance-measuring circuit
3 main sense input
4 reference sense input
5 memory
6 capacitive sense electrode
7 separate sensor
8 measured values
8' corrected main values
9 reference values

The invention claimed is:

1. A capacitive sensor device comprising a capacitance-measuring circuit, a main sense input and a reference sense input, wherein the capacitive sensor device is configured to measure, using the capacitance-measuring circuit, a current main value of capacitance seen by the main sense input and a current reference value of capacitance seen by the reference sense input, wherein the capacitive sensor device is configured to at least temporarily store at least one previously measured reference value, and wherein the capacitive sensor device is configured to use
   the current main value,
   the current reference value and the at least one previously measured reference value, and
   at least one current correction coefficient, with the capacitive sensor device being configured to adaptively determine the at least one current correction coefficient based on at least the current reference value and the at least one previously measured reference value,
   for determining a corrected current main value of capacitance
   wherein the main sense input is coupled with a capacitive sense electrode whose self-capacitance changes at an approach of a conductive body, and
wherein the reference sense input is coupled with a capacitive reference electrode, the capacitive reference electrode being a discrete reference capacitor arranged to measure a capacitance that is sensitive to environment drift.

2. The capacitive sensor device of claim 1, wherein the capacitive sensor device is configured to adaptively determine the at least one current correction coefficient by adaptively selecting, based on a selection criterion based on the current reference value and the at least one previously measured reference value, the at least one current correction coefficient from at least two predetermined correction coefficients, and wherein the selection criterion comprises a comparison to at least one threshold.

3. The capacitive sensor device of claim 2, wherein the capacitive sensor device is configured to determine a current difference reference value between the current reference value and a comparison reference value from the at least one previously measured reference value, and wherein the comparison comprises comparing the current difference reference value to the at least one threshold.

4. The capacitive sensor device of claim 3, wherein the at least two predetermined correction coefficients comprise a first first order correction coefficient and a second first order correction coefficient which differ from one another and wherein a single current correction coefficient is adaptively selected from the first first order correction coefficient and the second first order correction coefficient, wherein the at least one threshold comprises a single threshold, and wherein the capacitive sensor device is configured to determine whether the current difference reference value is larger or smaller than the single threshold, wherein for a larger current difference reference value the first first order correction coefficient is selected as the single current correction coefficient and for a smaller current difference reference value the second first order correction coefficient is selected as the single current correction coefficient, and wherein the capacitive sensor device is configured to determine the corrected current main value by subtracting the product of the single current correction coefficient and a cumulated difference reference value from the current main value.

5. The capacitive sensor device of claim 3, wherein the at least two predetermined correction coefficients comprise a first first order correction coefficient and a second first order correction coefficient which differ from one another and wherein a single current correction coefficient is adaptively selected from the first first order correction coefficient and the second first order correction coefficient, wherein the capacitive sensor device is configured to at least temporarily store at least one previously determined difference reference value, and wherein the capacitive sensor device is configured to determine a filtered current difference reference value by applying a filter to the current difference reference value and the at least one stored previously determined difference reference value, wherein the at least one threshold comprises a single threshold, and wherein the capacitive sensor device is configured to determine whether the filtered current difference reference value is larger or smaller than the single threshold, wherein for a larger filtered current difference reference value the first first order correction coefficient is selected as the single current correction coefficient and for a smaller current difference reference value the second first order correction coefficient is selected as the single current correction coefficient, and wherein the capacitive sensor device is configured to determine the corrected current main value by subtracting the product of the single current correction coefficient and a cumulated difference reference value from the current main value.

6. The capacitive sensor device of claim 3, wherein the at least two predetermined correction coefficients comprise a first first order correction coefficient, a second first order correction coefficient, a first second order correction coefficient and a second second order correction coefficient, wherein two current correction coefficients are adaptively selected from these four predetermined correction coefficients, wherein the at least one threshold comprises a single threshold, and wherein the capacitive sensor device is configured to determine whether the current difference reference value is larger or smaller than the single threshold, wherein for a larger current difference reference value the first first order correction coefficient is selected as a first current correction coefficient of the two current correction coefficients and the first second order correction coefficient is selected as a second current correction coefficient of the two current correction coefficients, and wherein for a smaller current difference reference value the second first order correction coefficient is selected as a first current correction coefficient of the two current correction coefficients and the second second order correction coefficient is selected as a second current correction coefficient of the two current correction coefficients, and wherein the capacitive sensor device is configured to determine the corrected current main value by subtracting the product of the first current correction coefficient and a cumulated difference reference value and the product of the second current correction coefficient with the square of the cumulated difference reference value from the current main value.

7. The capacitive sensor device of claim 2, wherein the at least one threshold comprises a first threshold and a second threshold, wherein the first threshold is smaller than the second threshold, and wherein the at least two predetermined correction coefficients comprise a first correction coefficient, a second correction coefficient and a third correction coefficient, wherein a single current correction coefficient is adaptively selected from these three predetermined correction coefficients, and wherein the capacitive sensor device is configured to select 1) the first correction coefficient as the single current correction coefficient if a cumulated difference reference value is smaller than the first threshold, 2) the second correction coefficient as the single current correction coefficient if the cumulated difference reference value is larger than or equal to the first threshold and smaller than or equal to the second threshold, and 3) the third correction coefficient as the single current correction coefficient if the cumulated difference reference value is larger than the second threshold, and wherein the capacitive sensor device is configured to determine the corrected current main value by subtracting the product of the single current correction coefficient and the cumulated difference reference value from the current main value.

8. The capacitive sensor device of claim 2, wherein the capacitive sensor device is configured to at least temporarily store at least one previously adaptively selected at least one correction coefficient, and wherein the capacitive sensor device is configured to determine at least one updated current correction coefficient by applying a filter to the 1) at least one current correction coefficient and the 2) at least one previously adaptively selected at least one correction coefficient, and wherein the capacitive sensor device is configured to replace the at least one current correction coefficient with the at least one updated current correction coefficient for determining the corrected current main value.

9. The capacitive sensor device of claim 8, wherein the filter is a finite impulse response (FIR) filter, or wherein the filter is a causal recursive infinite impulse response (IIR) filter with finitely many nonzero IIR filter coefficients.

10. The capacitive sensor device of claim 1, wherein the capacitive sensor device is configured to at least temporarily store at least one previously measured main value, and wherein the capacitive sensor device is configured to determine a current difference reference value between the current reference value and a comparison reference value from the at least one previously measured reference value and wherein the capacitive sensor device is configured to determine a current difference main value between the current main value and a comparison main value from the at least one previously measured main value, and wherein the capacitive sensor device is configured to at least temporarily store at least one previously determined difference reference value and at least one previously determined difference main value, wherein the capacitive sensor device is configured to determine a filtered current difference reference value by applying a filter to the current difference reference value and the at least one stored previously determined difference reference value and wherein the capacitive sensor device is configured to determine a filtered current difference main value by applying a filter to the current difference main value and the at least one stored previously determined difference main value, and wherein the capacitive sensor device is configured to adaptively determine a single current correction coefficient based on a ratio of the filtered current difference main value and the filtered current difference reference value, wherein the capacitive sensor device is configured to determine the corrected current main value by subtracting the product of the single current correction coefficient and a cumulated difference reference value from the current main value.

11. The capacitive sensor device of claim 10, wherein the capacitive sensor device is configured to determine the single current correction coefficient by comparing the ratio of the filtered current difference main value and the filtered current difference reference value to a lower threshold and/or to an upper threshold, with the upper threshold being larger than the lower threshold, and wherein the capacitive sensor device is configured to 1) set the single current correction coefficient to the lower threshold in case the ratio is smaller than the lower threshold, 2) set the single current correction coefficient to the upper threshold in case the ratio is larger than the upper threshold, and 3) otherwise set the single current correction coefficient to the ratio.

12. A portable electronic device comprising the capacitive sensor device of claim 1, wherein the capacitive sensor device is configured to generate a proximity signal based on the corrected current main value, and wherein the portable electronic device is configured to activate a predetermined action when the proximity signal is generated and/or when the proximity signal is extinguished.

13. The capacitive sensor device of claim 1, wherein the capacitive sense electrode is embodied as a conductor area on a printed circuit board, and/or wherein the capacitive reference electrode comprises tracks and/or conductor area on the printed circuit board or wherein the capacitive reference electrode is embodied as a discrete reference capacitor, and/or wherein the capacitive sensor device internally comprises the capacitive reference electrode, and wherein the capacitance of the capacitive reference electrode is less affected by the approach of the conductive body than the capacitance of the capacitive sense electrode.

14. The portable electronic device of claim 12, wherein the predetermined action is one of: change a power of a radio transmitter, switch on or off a display backlight, enable or disable a tactile input interface.

* * * * *